US012074575B2

(12) United States Patent
Elsayed et al.

(10) Patent No.: US 12,074,575 B2
(45) Date of Patent: Aug. 27, 2024

(54) LOW POWER ACTIVE PHASE SHIFTER FOR PHASE-ARRAY SYSTEMS

(71) Applicant: Samsung Electronics Co., Ltd., Suwon-si (KR)

(72) Inventors: Omar Abdulmonem Mohamed Elsayed, San Jose, CA (US); Venumadhav Bhagavatula, Santa Clara, CA (US); Tienyu Chang, Sunnyvale, CA (US); Siu-Chuang Ivan Lu, San Jose, CA (US); Sangwon Son, Palo Alto, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

(21) Appl. No.: 17/746,856

(22) Filed: May 17, 2022

(65) Prior Publication Data

US 2022/0399864 A1 Dec. 15, 2022

Related U.S. Application Data

(60) Provisional application No. 63/208,851, filed on Jun. 9, 2021.

(51) Int. Cl.
*H03G 3/30* (2006.01)
*H03F 3/45* (2006.01)
(Continued)

(52) U.S. Cl.
CPC .......... *H03G 3/30* (2013.01); *H03F 3/45475* (2013.01); *H03K 5/01* (2013.01); *H03G 2201/103* (2013.01); *H03K 2005/00286* (2013.01)

(58) Field of Classification Search
CPC ............. H03G 3/30; H03G 2201/103; H03F 3/45475; H03K 5/01; H03K 2005/00286
See application file for complete search history.

(56) References Cited

U.S. PATENT DOCUMENTS 6,311,046 B1 10/2001 Dent
7,304,539 B2 * 12/2007 Tsurumaki .............. H03F 1/301
330/296

(Continued)

OTHER PUBLICATIONS

Wu, T., et al., "A Ku-Band 6-Bit Vector-Sum Phase Shifter with Half-Quadrant Control Technique," IEEE Access, vol. XX, Feb. 2017, 8 pages.

(Continued)

*Primary Examiner* — Metasebia T Retebo
*Assistant Examiner* — James G Yeaman
(74) *Attorney, Agent, or Firm* — Lewis Roca Rothgerber Christie LLP

(57) ABSTRACT

A variable gain amplifier includes a first transconductor circuit coupled to a first input terminal, a first output terminal, and a second output terminal of the variable gain amplifier, the first transconductor circuit including: a plurality of positive coefficient transistors coupled to the first output terminal and configured to selectively conduct current in response to a first binary code, a plurality of negative coefficient transistors coupled to the second output terminal and configured to selectively conduct current in response to a second binary code, and a plurality of amplifying transistors, each having a gate electrode coupled to the first input terminal, a first electrode coupled to a ground reference, and a second electrode coupled to a pair of coefficient transistors including one of the plurality of positive coefficient transistors and one of the plurality of negative coefficient transistors.

20 Claims, 5 Drawing Sheets

(51) Int. Cl.
*H03K 5/00* (2006.01)
*H03K 5/01* (2006.01)

(56) References Cited

U.S. PATENT DOCUMENTS

| | | | |
|---|---|---|---|
| 7,701,296 B2* | 4/2010 | Inoue | H03F 3/211 |
| | | | 330/298 |
| 10,574,287 B1 | 2/2020 | Egambaram et al. | |
| 2010/0026367 A1* | 2/2010 | Jiang | H03B 28/00 |
| | | | 327/355 |
| 2014/0104964 A1* | 4/2014 | Peng | G11C 5/147 |
| | | | 365/189.09 |
| 2014/0155003 A1 | 6/2014 | Nakatani | |
| 2020/0382088 A1* | 12/2020 | Saha | H03C 5/00 |
| 2021/0249994 A1 | 8/2021 | Bhatia | |

OTHER PUBLICATIONS

Duan, Z., et al., "A 6-bit CMOS Active Phase Shifter for Ku-Band Phased Arrays," in IEEE Microwave and Wireless Components Letters, vol. 28, No. 7, pp. 615-617, Jul. 2018.

* cited by examiner

| Phase Code | Code | | | | I ON | Q ON | $\sqrt{I^2+Q^2}$ | $\tan^{-1}$ Q/I | # of On Paths | # of Active Paths | # of Passive Paths |
|---|---|---|---|---|---|---|---|---|---|---|---|
| | I Plus | I Minus | Q Plus | Q Minus | | | | | | | |
| 0 | "1111" | "0000" | "1000" | "1000" | 10 | 0 | 10 | 0 | 14 | 10 | 4 |
| 1 | "1110" | "0000" | "1001" | "0001" | 9 | 4 | 9.84 | 24 | 14 | 13 | 1 |
| 2 | "1100" | "0000" | "1100" | "0000" | 7 | 7 | 9.9 | 45 | 14 | 14 | 0 |
| 3 | "1001" | "0001" | "1110" | "0000" | 4 | 9 | 9.84 | 66 | 14 | 13 | 1 |
| 4 | "1000" | "1000" | "1111" | "0000" | 0 | 10 | 10 | 90 | 14 | 10 | 4 |
| 5 | "0001" | "1001" | "1110" | "0000" | -4 | 9 | 9.84 | 114 | 14 | 13 | 1 |
| 6 | "0000" | "1100" | "1100" | "0000" | -7 | 7 | 9.9 | 135 | 14 | 14 | 0 |
| 7 | "0000" | "1110" | "1001" | "0001" | -9 | 4 | 9.84 | 156 | 14 | 13 | 1 |
| 8 | "0000" | "1111" | "1000" | "1000" | -10 | 0 | 10 | 180 | 14 | 10 | 4 |
| 9 | "0000" | "1110" | "0000" | "1001" | -9 | -4 | 9.84 | 204 | 14 | 13 | 1 |
| 10 | "0000" | "1100" | "0000" | "1100" | -7 | -7 | 9.9 | 225 | 14 | 14 | 0 |
| 11 | "0001" | "1001" | "0000" | "1110" | -4 | -9 | 9.84 | 246 | 14 | 13 | 1 |
| 12 | "1000" | "1000" | "0000" | "1111" | 0 | -10 | 10 | 270 | 14 | 10 | 4 |
| 13 | "1001" | "0001" | "0000" | "1110" | 4 | -9 | 9.84 | 294 | 14 | 13 | 1 |
| 14 | "1100" | "0000" | "0000" | "1100" | 7 | -7 | 9.9 | 315 | 14 | 14 | 0 |
| 15 | "1110" | "0000" | "0001" | "1001" | 9 | -4 | 9.84 | 336 | 14 | 13 | 1 |

FIG. 5

LOW POWER ACTIVE PHASE SHIFTER FOR PHASE-ARRAY SYSTEMS

CROSS-REFERENCE TO RELATED APPLICATION

This application claims priority to, and the benefit of, U.S. Provisional Application No. 63/208,851 ("4-Bit Low Power Active Phase Shifter for mmWave Phase-Array Chip"), filed on Jun. 9, 2021, the entire content of which is incorporated herein by reference.

FIELD

Embodiments of the present invention relate to the field of phase-array systems.

BACKGROUND

The development of 5G, which is the new generation of broadband cellular networks, has increased interest in developing improved phase shifters due to the demand for accurate beam steering and beam forming in phased-array systems. Generally, phase shifters can be implemented in active or passive form. The passive phase shifters often have high insertion loss and also utilize bulky inductors and capacitors which result in large chip sizes. Compared with passive phase shifters, active phase shifter have a smaller foot print, which makes them suitable for millimeter-wave phased arrays. However, active phase shifters have higher power consumption than their passive counterparts, which is undesirable.

The above information disclosed in this Background section is only for enhancement of understanding of the background of the invention and therefore it may contain information that does not form the prior art that is already known to a person of ordinary skill in the art.

SUMMARY

Aspects of some embodiments of the present invention are directed to an active phase shifter having a small footprint and lower power consumption as compared with phase shifters of the related art. In some embodiments, the active phase shifter includes a variable gain amplifier having reduced power consumption and reduced common-mode current. In some examples, the active phase shifter may reduce power consumption by 30%, as compared to the related art.

According to embodiments of the present invention, there is provided a variable gain amplifier including: a first transconductor circuit coupled to a first input terminal, a first output terminal, and a second output terminal of the variable gain amplifier, the first transconductor circuit including: a plurality of positive coefficient transistors coupled to the first output terminal and configured to selectively conduct current in response to a first binary code; a plurality of negative coefficient transistors coupled to the second output terminal and configured to selectively conduct current in response to a second binary code; and a plurality of amplifying transistors, each having a gate electrode coupled to the first input terminal, a first electrode coupled to a ground reference, and a second electrode coupled to a pair of coefficient transistors including one of the plurality of positive coefficient transistors and one of the plurality of negative coefficient transistors.

In some embodiments, the one of the plurality of positive coefficient transistors and the one of the plurality of negative coefficient transistors of the pair of coefficient transistors have a same size and are configured to conduct a same current when activated.

In some embodiments, the plurality of amplifying transistors includes a first amplifying transistor and successive amplifying transistors, and the first amplifying transistor is configured to conduct a first current signal and the successive amplifying transistors are configured to conduct multiples of the first current signal.

In some embodiments, the successive amplifying transistors have channel widths that are multiples of a channel width of the first amplifying transistor.

In some embodiments, channel widths of successive ones of the positive coefficient transistors are multiples of a channel width of a first one of the positive coefficient transistors corresponding to the first amplifying transistor.

In some embodiments, a gate of each one of the plurality of positive coefficient transistors is configured to receive a bit of the first binary code, and a gate of each one of the plurality of negative coefficient transistors is configured to receive a bit of the second binary code.

In some embodiments, the first and second binary codes are supplied by a gain controller.

In some embodiments, the variable gain amplifier further includes: a second transconductor circuit coupled to a second input terminal of the variable gain amplifier, and coupled to the first output terminal and the second output terminal.

In some embodiments, the first and second input terminals correspond to differential input terminals of the variable gain amplifier, and the first and second output terminals correspond to differential output terminals of the variable gain amplifier.

In some embodiments, the first and second transconductor circuits are configured to generate a differential current output.

In some embodiments, the first transconductor circuit is configured to generate a first amplified signal at the first output terminal, the first amplified signal corresponding to a summation of currents of activated ones of the positive coefficient transistors of the first transconductor circuit minus currents of activated ones of negative coefficient transistors of the second transconductor circuit.

In some embodiments, the second transconductor circuit is configured to generate a second amplified signal at the second output terminal, the second amplified signal corresponding to a summation of currents of activated ones of positive coefficient transistors of the second transconductor circuit minus currents of activated ones of the negative coefficient transistors of the first transconductor circuit.

According to embodiments of the present invention, there is provided a variable gain amplifier including: a first transconductor circuit coupled to a first input terminal, a first output terminal, and a second output terminal of the variable gain amplifier; and a second transconductor circuit coupled to a second input terminal of the variable gain amplifier, and coupled to the first output terminal and the second output terminal, each of the first and second transconductor circuits including: a plurality of positive coefficient transistors coupled to one of the first and second output terminals and configured to selectively conduct current in response to a first binary code; a plurality of negative coefficient transistors coupled to the an other of the first and second output terminals and configured to selectively conduct current in response to a second binary code; and a plurality of amplifying transistors, each having a gate electrode coupled to one of the first and second input terminals, a first electrode coupled to a ground reference, and a second electrode coupled to a pair of coefficient transistors including one of the plurality of positive coefficient transistors and one of the plurality of negative coefficient transistors.

In some embodiments, the first and second input terminals correspond to differential input terminals of the variable gain amplifier, the first and second output terminals correspond to differential output terminals of the variable gain amplifier, and the first and second transconductor circuits are configured to generate a differential current output.

In some embodiments, the first transconductor circuit is configured to generate a first amplified signal at the first output terminal, the first amplified signal corresponding to a summation of currents of activated ones of the positive coefficient transistors of the first transconductor circuit minus currents of activated ones of negative coefficient transistors of the second transconductor circuit.

In some embodiments, the second transconductor circuit is configured to generate a second amplified signal at the second output terminal, the second amplified signal corresponding to a summation of currents of activated ones of positive coefficient transistors of the second transconductor circuit minus currents of activated ones of the negative coefficient transistors of the first transconductor circuit.

In some embodiments, a gate of each one of the plurality of positive coefficient transistors is configured to receive a bit of the first binary code, and a gate of each one of the plurality of negative coefficient transistors is configured to receive a bit of the second binary code.

In some embodiments, the plurality of amplifying transistors includes a first amplifying transistor and successive amplifying transistors, the first amplifying transistor is configured to conduct a first current signal and the successive amplifying transistors are configured to conduct multiples of the first current signal, and the successive amplifying transistors have channel widths that are multiples of a channel width of the first amplifying transistor.

In some embodiments, channel widths of successive ones of the positive coefficient transistors are multiples of a channel width of a first one of the positive coefficient transistors corresponding to the first amplifying transistor.

According to embodiments of the present invention, there is provided a phase shifter including: a first variable gain amplifier configured to scale an amplitude of a first quadrature vector based on a first binary code and a second binary code; and a second variable gain amplifier configured to scale an amplitude of a second quadrature vector based on a third binary code and a fourth binary code, the first variable gain amplifier having a first input terminal, a second input terminal, a first output terminal, and a second output terminal, and including: a first transconductor circuit coupled to the first input terminal and the first and second output terminals; and a second transconductor circuit coupled to the second input terminal and the first and second output terminals, each of the first and second transconductor circuits including: a plurality of positive coefficient transistors coupled to one of the first and second output terminals and configured to selectively conduct current in response to a first binary code; a plurality of negative coefficient transistors coupled to the an other of the first and second output terminals and configured to selectively conduct current in response to a second binary code; and a plurality of amplifying transistors, each having a gate electrode coupled to one of the first and second input terminals, a first electrode coupled to a ground reference, and a second electrode coupled to a pair of coefficient transistors including one of the plurality of positive coefficient transistors and one of the plurality of negative coefficient transistors.

BRIEF DESCRIPTION OF THE DRAWINGS

The accompanying drawings, together with the specification, illustrate example embodiments of the present invention, and, together with the description, serve to explain the principles of the present invention.

FIG. 5 is a table illustrating the binary codes applied to the first and second variable gain amplifiers and the corresponding phase shifts achieved by the active phase shifter, according to some examples of the present disclosure.

DETAILED DESCRIPTION

Figure 1:
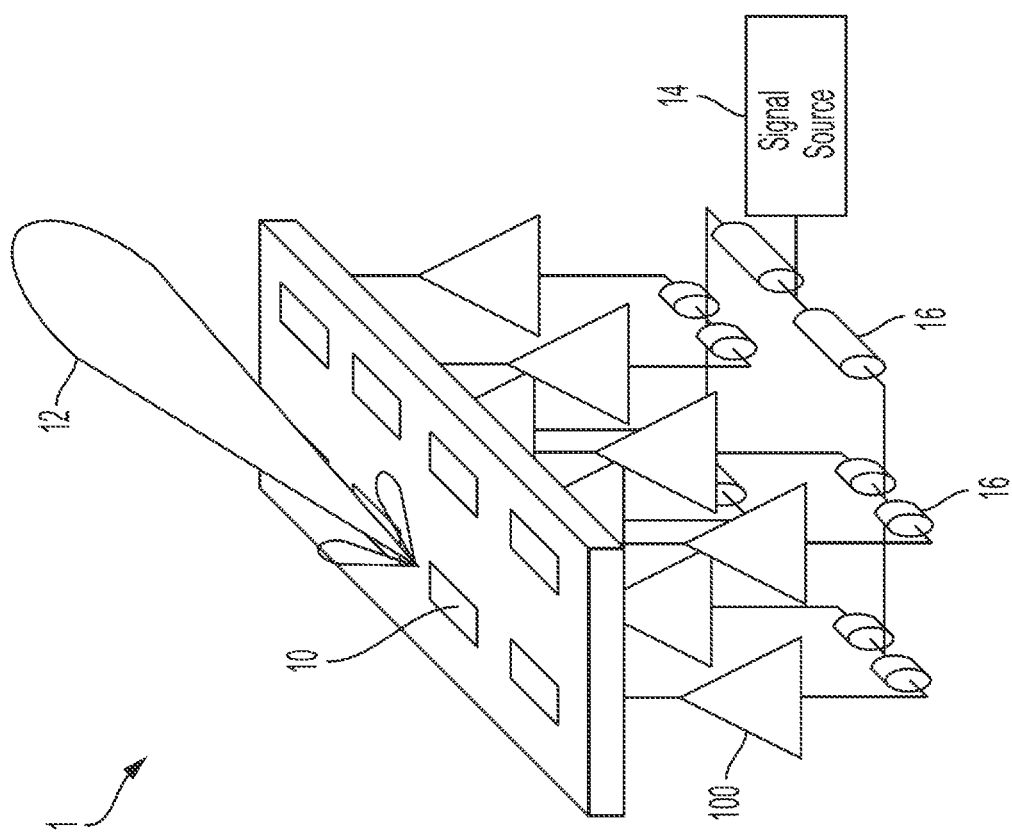
FIG. 1 illustrates a phase array system, according to some embodiments of the present disclosure.

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as available for other similar features or aspects in other exemplary embodiments. Like reference numerals designate like elements throughout the specification.

Aspects of some embodiments of the present disclosure are directed to a compact active phase shifter utilizing one or more variable-gain amplifiers, which exhibit low power consumption and small footprint. The variable gain amplifier may provide about a 30% reduction in power consumption, as compared to those of the related art. In some embodiments, the current consumption and input impedance of the variable gain amplifier is constant for all phase states. The active phase shifter may be used in both the receiver side and transmitter side of a phase array. These features make the active phase shifter suitable for use in 5G mmwave phase array systems (e.g., phase array chips).

FIG. 1 illustrates a phase array system 1, according to some embodiments of the present disclosure.

The phase array system (e.g., the phase array chip) 1 includes an arrangement of antennas 10 that are spaced apart from one another (e.g., at regular intervals), and one or more active phase shifters 100 configured to vary/shift the relative phase of the signal transmitted by the antennas 10 to produce a steered radiation pattern or beam 12. By adjusting the relative phase of the antennas 10, the beam can be aimed in various directions electronically, thus overcoming the limited speed and reliability problems of mechanically-steered parabolic dish antennas. As a result, a phase array 1 can greatly reduce the size, weight, and power consumption of a directed antenna system, making it particularly suitable for compact, electronic communication systems. As in the example of FIG. 1, the phase array 1 and its constituent components (e.g., phase shifters 100) may be integrated into a chip to provide a compact, flat-panel/planar phase array antenna design. As shown in FIG. 1, the active phase shifters 100 may shift a signal supplied by the signal source 14 via one or more splitter transmission lines 16.

According to some examples, the phase array may be utilized in a signal receiver or transmitter.

Figure 2A:
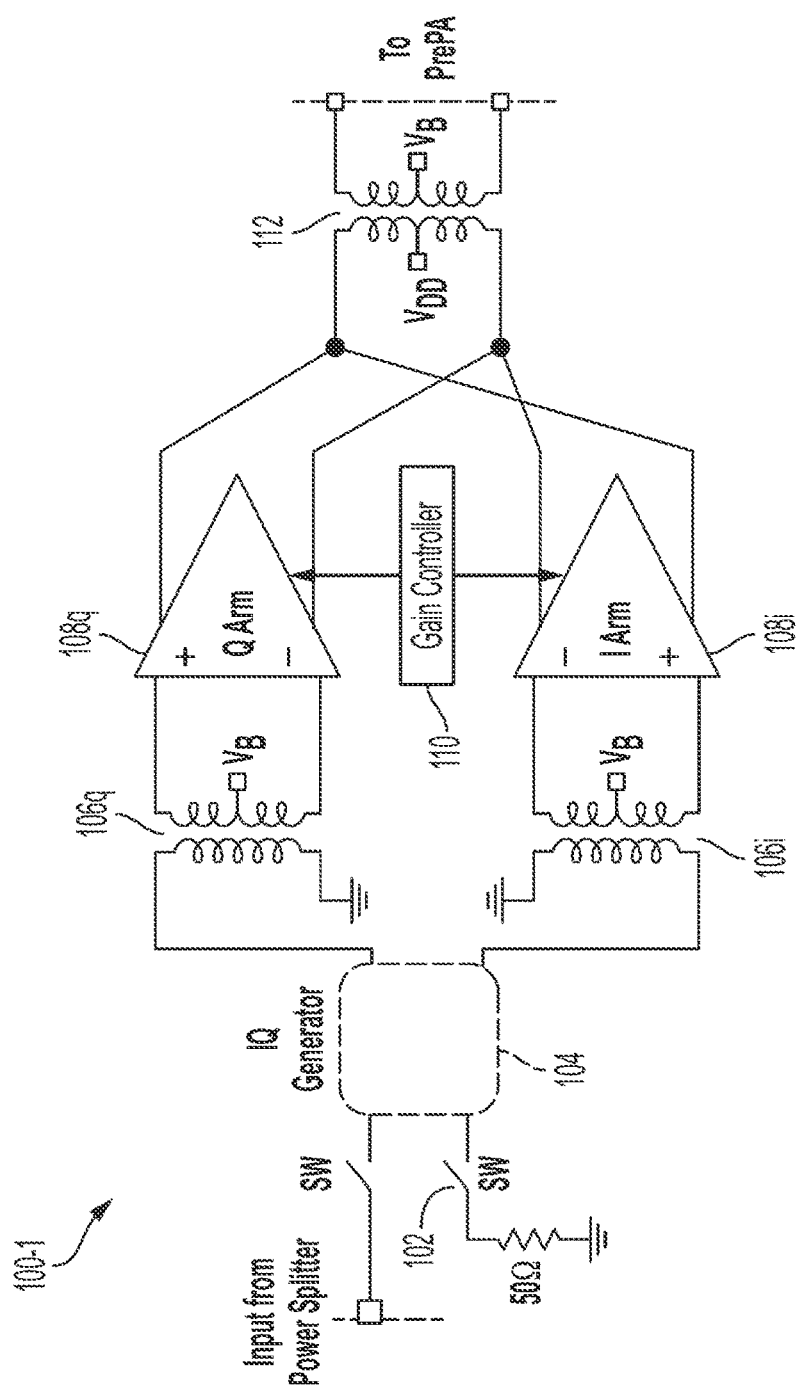
FIG. 2A illustrates an active phase shifter being utilized in a phase array transmitter, according to some embodiments of the present disclosure.
Figure 2B:
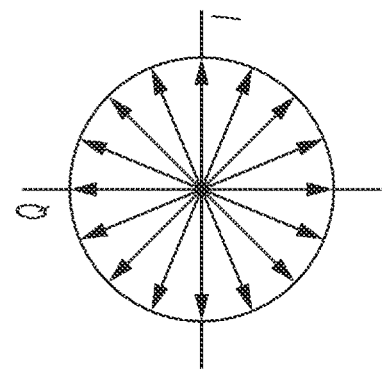
FIG. 2B is a phasor diagram illustrating a number of possible signal phase shifts that may be achieved via the active phase shifter, according to some embodiments of the present disclosure.

FIG. 2A illustrates an active phase shifter 100-1 being utilized in a phase array transmitter, according to some embodiments of the present disclosure. FIG. 2B is a phasor diagram illustrating a number of possible signal phase shifts that may be achieved via the active phase shifter 100-1, according to some embodiments of the present disclosure.

Referring to FIG. 2A, the active phase shifter 100-1 receives a single-ended transmission signal from a mixer or power splitter. The architecture of the active phase shifter 100-1 includes a switch 102 at its input for activating/deactivating the signal path of the active phase shifter 100-1; a passive I/Q generator 104 for generating I and Q signal components based on the input single-ended transmission signal; first and second baluns 106$q$ and 106$i$ for respectively converting the I and Q signal components to differential signals; and first and second variable gain amplifiers 108$q$ and 108$i$ for variably amplifying the differential I and Q signal components based on code values provided by a gain controller 110, and for generating a phase shifted differential signal (e.g., a phase-shifted differential current signal) having a desired polarity and amplitude. A transformer 112 at the output of the phase shifter 100-1 allows for coupling to a preamplifier, which feeds an antenna of the phase array. In the phase shifter (which may also be referred to as a vector-sum phase shifter) 100-1, the phase shifting is achieved by scaling the amplitudes of quadrature vectors I and Q with variable gain amplifiers 108$q$ and 108$i$.

The first and second variable gain amplifiers 108$q$ and 108$i$ provide independent control of the amplitude of the I and Q signal components, which can result in a combined signal (i.e., I+Q signal) having any desired phase or phase shift. For example, when the variable gain amplifiers 108$q$ and 108$i$ produce signals having the same positive amplitude, the resulting combined signal would have a phase shift of 45°.

FIG. 2B illustrates an example in which 4-bit binary codes supplied by the gain controller 110 can control (e.g., vary the gain of) the first and second variable gain amplifiers 108$q$ and 108$i$ to generate signal phase shifts that are integer multiples of 22.5° (=360°/$2^4$). However, embodiments of the present disclosure are not limited to this example, as changing the number of bits in the control codes provided by the gain controller 110 and changing the corresponding structures within the variable gain amplifiers 108$q$ and 108$i$ accordingly, can yield phase shifts having any suitable step size/precision.

Figure 3:
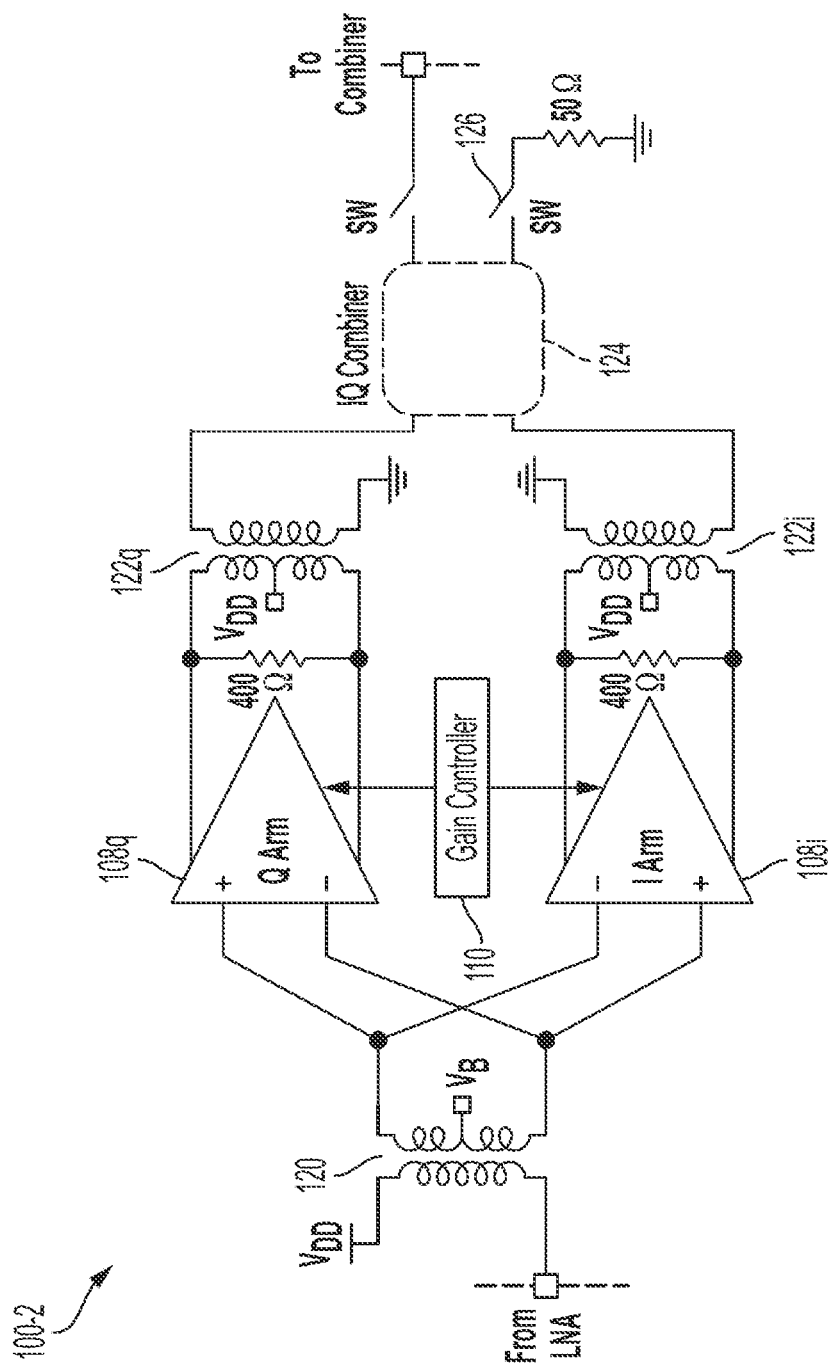
FIG. 3 illustrates an active phase shifter being utilized in a phase array receiver, according to some embodiments of the present disclosure.

FIG. 3 illustrates an active phase shifter 100-2 being utilized in a phase array receiver, according to some embodiments of the present disclosure.

Referring to FIG. 3, the active phase shifter 100-2 receives a single-ended signal received from an antenna or a low-noise amplifier coupled between the antenna and the phase shifter. The active phase shifter 100-2 includes a balun 120 for converting the single-ended signal to a differential signal; first and second variable gain amplifiers 108$q$ and 108$i$ for variably amplifying the differential signal from the balun 120 based on code values provided by a gain controller 110, and for generating a phase shifted differential signal (e.g., a phase-shifted differential current signal) having a desired polarity and amplitude; first and second baluns 122$q$ and 122$i$ to transform the amplified I and Q differential signal components to single ended I and Q signal components; and a quadrature coupler 124 with I and Q relative phase at the output of the phase shifter 100-2 for providing a single-ended transmission signal to the output node (e.g., to a combiner).

In some embodiments, the first and second variable-gain amplifiers 108$q$ and 108$i$ have identical circuit implementations.

Figure 4:
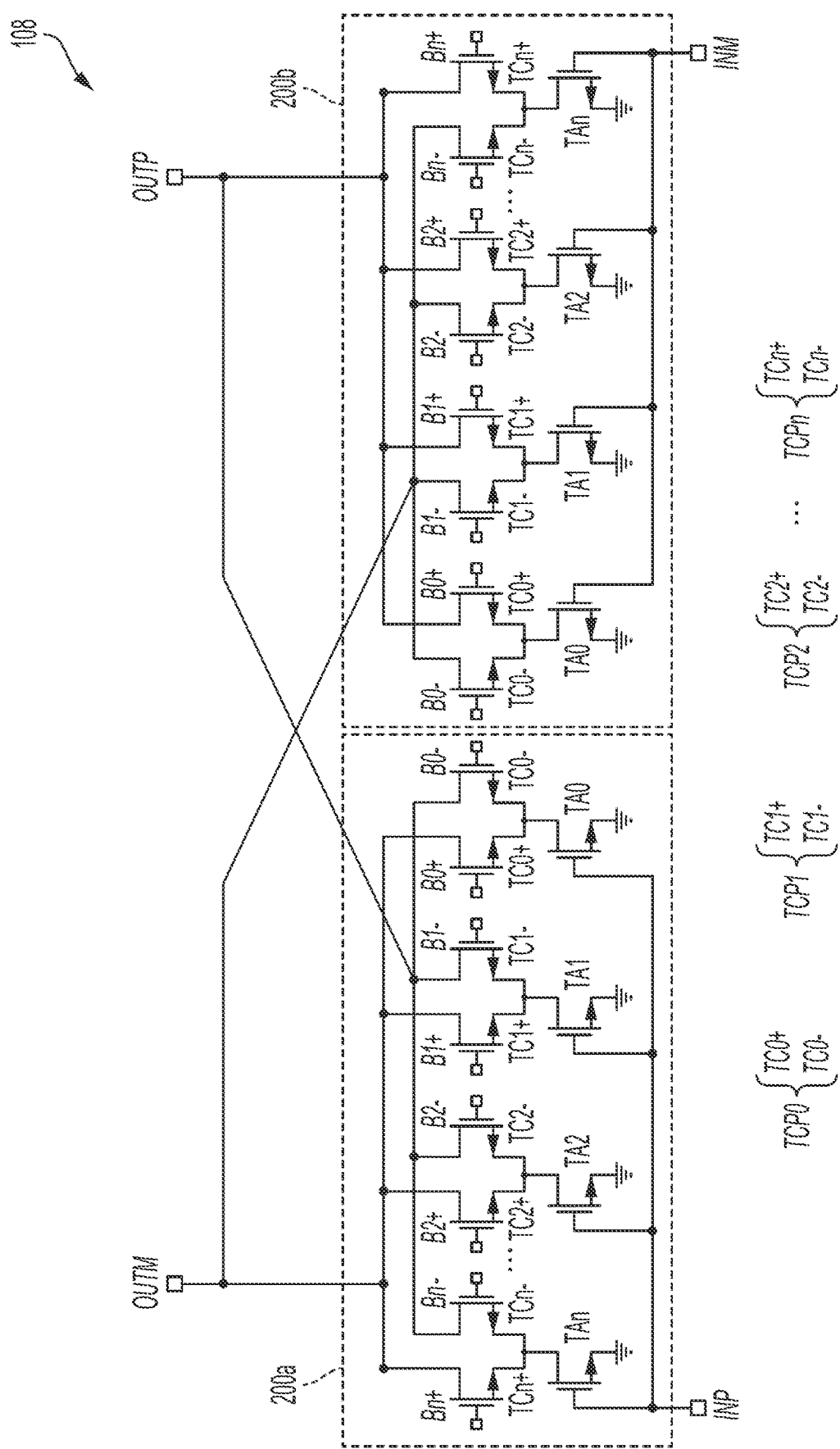
FIG. 4 illustrates a circuit diagram of a variable gain amplifier of the phase shifter, according to some embodiments of the present disclosure.

FIG. 4 illustrates a circuit diagram of a variable gain amplifier 108 (e.g., 108$q$/108$i$) of the phase shifter 100 (e.g., 100-1/100-2), according to some embodiments of the present disclosure. As will be understood by a person of ordinary skill in the art the variable gain amplifier 108 may include elements other than those shown in FIG. 4, such as electronic components for DC biasing the transistors shown in FIG. 4. Such elements have been omitted from FIG. 4 for brevity and clarity purposes.

The variable gain amplifier 108 is a differential amplifier with controllable gain, which receives a differential input signal (e.g., a differential input voltage) at its first and second input terminals (e.g., positive and negative input terminals) INP and INM, and generates a differential output signal (e.g., a differential output current) at its first and second output terminals (e.g., positive and negative output terminals) OUTM and OUTP. In some embodiments, the variable gain amplifier 108 has a symmetric structure with two transconductor circuits 200 that are structurally the same but connected to different input terminals. The first transconductor circuit 200$a$ may be coupled to the first input terminal INP and the first and second output terminals OUTM and OUTP, and the second transconductor circuit 200$b$ may be coupled to the second input terminal INM and the first and second output terminals OUTM and OUTP.

According to some embodiments, each of the first and second transconductor circuits 200$a$ and 200$b$ includes a plurality of positive coefficient transistors TC0+ to TCn+ (n being an integer greater than 0) coupled to the first output terminal OUTM, which are configured to selectively conduct current in response to a first binary code ([Bn+ . . . B0+]), and further incudes a plurality of negative coefficient transistors TC0− to TCn− coupled to the second output terminal OUTP, which are configured to selectively conduct current in response to a second binary code ([Bn− . . . B0−]). As shown in FIG. 4, the gate of each one of the plurality of positive coefficient transistors is configured to receive a bit of the first binary code ([Bn+ . . . B0+]), and a gate of each one of the plurality of negative coefficient transistors is configured to receive a bit of the second binary code. The first and second binary codes may be supplied to the variable gain amplifier 108 by the gain controller 110. Each of the first and second transconductor circuits 200$a$ and 200$b$ further includes a plurality of amplifying transistors TA0 to TAn (also referred to as gm cells or common-source amplifiers), each having a gate electrode coupled to the first input terminal INP, a first electrode coupled to a ground reference (GND), and a second electrode coupled to, and configured to conduct the current of, a corresponding pair of coefficient transistors. For example, an ith (1≤i≤n) amplifying transistor Tai is coupled to an ith pair of coefficient transistors, which includes the ith positive coefficient transistor TCi+ and the ith negative coefficient transistor TCi−.

As a result of the crisscrossed connections of the positive and negative coefficient transistors of the two transconductor circuits 200a and 200b, the current at the first output terminal OUTM (i.e., the first amplified signal) is equal to the summation of the currents from the first plurality of positive coefficient transistors TC0+ to TCn+ of the first transconductor circuit 200a minus the summation of the currents from the second plurality of negative coefficient transistors TC0− to TCn− of the second transconductor circuit 200b. Similarly, the current at the second output terminal OUTP (i.e., the second amplified signal) is equal to the summation of the currents from the second plurality of positive coefficient transistors TC0+ to TCn+ of the second transconductor circuit 200b minus the summation of the currents from the first plurality of negative coefficient transistors TC0− to TCn− of the first transconductor circuit 200a.

Each amplifying transistor TA together with the corresponding pair of coefficient transistors TCi+ and TCi− forms a cascode amplifier that acts as one of n conductive branches of the corresponding transconductive circuit 200a/b.

The conductive branches may be weighed to conduct different currents when the corresponding transistors are activated. In some embodiments, the two coefficient transistors in each pair of coefficient transistors (e.g., TCi+ and TCi−) have the same or substantially the same size (e.g., channel width) such that they conduct the same or substantially the same current when both are activated. However, successive amplifying transistors TAi may be sized to conducts currents that are multiples of (e.g., successive integer multiples of) the first current conducted by the first amplifying transistor TA1, when activated. The relative sizes (e.g., relative channel widths) of the amplifying transistors may follow a scaling pattern. Similarly, relative sizes (e.g., relative channel widths) of the pairs of the coefficient transistors follow the same scaling pattern. For example, in the case of n=3 (i.e., when the transconductive circuit 200a/b includes four cascode amplifiers or conductive branches), the first amplifying transistor TA0 may have a channel width of WA, the second, third, and fourth amplifying transistors may have channels widths that are 2×WA, 3×WA, and 4×WA, respectively. Similarly, the coefficient transistors (TC0+ and TC0−) of the first pair of coefficient transistors TCP0 may have a channel width of WC, and the coefficient transistors of the second, third, and fourth pair of coefficient transistors TCP1, TCP2, and TCP3 may have channels widths that are 2×WC, 3×WC, and 4×WC, respectively. As will be understood by a person of ordinary skill in the art, the size ratios (e.g., relative "weights") of the coefficient transistors and amplifying transistors are not limited to being integer multiples of the first coefficient transistor and first amplifying transistor, and the size ratios may assume any suitable non-integer values.

The relative sizes of the coefficient and amplifying transistors may be chosen to enable phase shifts having a desirable precision/step size. For example, in the in the case of n=3, where the relative weights are 1×, 2×, 3×, and 4× (as provided in the example above), phase shifts that are integer multiples of 22.5° (e.g., 0°, 22.5°, 45°, 67.5°, 90°, etc.) or approximations thereof are enabled, and be achieved by applying suitable code values to the coefficient transistors of the first and second variable gain amplifiers 108q and 108i of the active phase shifter 100-1.

FIG. 5 is a table illustrating the binary codes applied to the first and second variable gain amplifiers 108q and 108i and the corresponding phase shifts achieved by the active phase shifter 100-1, according to some examples of the present disclosure. FIG. 5 illustrates a table corresponding to the example of n=3 and the relative weights of 1×, 2×, 3×, and 4×, discussed above.

Referring to FIG. 5, in the example of phase code '1', the gain controller 110 applies a binary code of 1110 to the positive coefficient transistors TC0+ to TC3+ of the second variable gain amplifier 108i, which deactivates the first positive coefficient transistors TC0+ and activates the second to fourth positive coefficient transistors TC1+ to TC3+; and applies a binary code of 0000 to the negative coefficient transistors TC0− to TC3− of the second variable gain amplifier 108i, which deactivates all of the negative coefficient transistors TC0− to TC3−. Thus, the weight of the activated coefficient transistors of the second variable gain amplifier 108i is 9 (=[1×4+1×3+1×2+0×1]−[0×4+0×3+0×2+0×1]). Thus, the second variable gain amplifier 108i generates a I-component signal of amplitude 9.

In the example of phase code '1', the gain controller 110 applies a binary code of 1001 to the positive coefficient transistors TC0+ to TC3+ of the first variable gain amplifier 108q, which activates the first and fourth positive coefficient transistors TC0+ and TC3+ and deactivates the second and third positive coefficient transistors TC1+ and TC2+; and applies a binary code of 0001 to the negative coefficient transistors TC0− to TC3− of the first variable gain amplifier 108q, which activates the first negative coefficient transistors TC0− and deactivates the second to fourth negative coefficient transistors TC1− to TC3−. Thus, the weight of the activated coefficient transistors of the first variable gain amplifier 108q is 4 (=[1×4+0×3+0×2+1×1]−[0×4+0×3+0×2+1×1]). Thus, the first variable gain amplifier 108q generates a Q-component signal of amplitude 4.

As a result, the combined signal has an amplitude of 9.84 and a phase shift of about 24°, which is approximate to the desired target of 22.5°. As is shown in the table of FIG. 5, by applying appropriate binary code values to the first and second variable gain amplifiers 108q and 108i, the active phase shifter 100-1 is capable of generating a phase-shifted signal (e.g., a phase-shifted differential current signal) having a magnitude of about 10 and a phase that is approximately any integer multiple of 22.5°.

As can be observed from the table of FIG. 5, regardless of phase state, i.e., the phase shift created by the variable gain amplifiers 108q and 108i, the same current is conducted (e.g., with a current weight of 14). Therefore, when the active phase shifter 100-2 is utilized in a receiver (as, e.g., shown in FIG. 3), conducting the same current regardless of phase state produces a constant input impedance. This is a desirable affect as it results in the low noise amplifier, which may be coupled to the input of the active phase shifter 100-2, experiencing a constant loading and thus being able to produce the same gain regardless of the phase state.

Further, in all states, phase shifts are achieved while reducing (e.g., minimizing) power consumption, since the cancelation current from the negative coefficient transistors (referred to as the # of passive paths in FIG. 5) is small relative to the positive contribution of the positive coefficient transistors (referred to as the # of active paths in FIG. 5). In the example of phase code 1, the currents being conducted by the variable gain amplifiers 108q and 108i have a weight of 14 (indicated in FIG. 5 as the # of on paths). Of this conducted current, an amount equivalent to a weight of 13 is attributable to current from the positive coefficient transistors, which positively contribute to the output signal, and only an amount equivalent to a weight of one is due to cancelation current from the negative coefficient transistors. Indeed, as can be observed from the table of FIG. 5, in most states, the number of passive paths is either zero or one. This is in contrast to the related art in which there is cancelation current (i.e., wasted current) in all phase states and the percentage of cancelation current relative to the current positively contributing to the output signal is higher than that of the active phase shifter 100-1. In some examples, by reducing waste current through gm slicing, variable gain amplifiers 108*q* and 108*i* may reduce the overall power consumption of the active phase shifter 100-1 by about 27% relative to the related art, while achieving the same or substantially the same gain performance.

While one or more exemplary embodiments have been described with reference to the figures, it will be understood by those of ordinary skill in the art that various suitable changes in form and details may be made therein without departing from the spirit and scope as defined by the following claims, and equivalents thereof.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

It will be understood that when an element, component, or layer is referred to as being "connected to" or "coupled to" another element or layer, it can be directly connected to or coupled to the other element or layer, or one or more intervening elements, components, or layers may be present. When an element or layer is referred to as being "directly on," "directly connected to" or "directly coupled to" another element, component, or layer, there are no intervening elements, component, or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The active phase shifter and/or any other relevant devices or components according to embodiments of the present invention described herein, such as the gain controller, may be implemented utilizing any suitable hardware, firmware (e.g. an application-specific integrated circuit, field programmable gate arrays, and/or the like), software, or a suitable combination of software, firmware, and hardware. For example, the various components of each of the gain controller may be formed on one integrated circuit (IC) chip or on separate IC chips. Further, the various components of the active phase shifter may be implemented on a flexible printed circuit film, a tape carrier package (TCP), a printed circuit board (PCB), or formed on a same substrate. Further, the various components of the gain controller may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

What is claimed is:

1. A variable gain amplifier comprising:
    a first transconductor circuit coupled to a first input terminal, a first output terminal, and a second output terminal of the variable gain amplifier, the first transconductor circuit comprising:
        a plurality of positive coefficient transistors coupled to the first output terminal and configured to selectively conduct current in response to a first binary code, each of the positive coefficient transistors receiving a different bit of the first binary code;
        a plurality of negative coefficient transistors coupled to the second output terminal and configured to selectively conduct current in response to a second binary code, each of the negative coefficient transistors receiving a different bit of the second binary code; and
        a plurality of amplifying transistors, each having a gate electrode coupled to the first input terminal such that each of the gate electrodes of the plurality of amplifying transistors receives the same signal with the same voltage from the first input terminal, a first electrode coupled to a ground reference, and a second electrode coupled to a different pair of coefficient transistors comprising one of the plurality of positive coefficient transistors and one of the plurality of negative coefficient transistors.

2. The variable gain amplifier of claim 1, wherein the one of the plurality of positive coefficient transistors and the one of the plurality of negative coefficient transistors of the pair of coefficient transistors have a same size and are configured to conduct a same current when activated.

3. The variable gain amplifier of claim 1, wherein the plurality of amplifying transistors comprises a first amplifying transistor and successive amplifying transistors, and
    wherein the first amplifying transistor is configured to conduct a first current signal and the successive amplifying transistors are configured to conduct multiples of the first current signal.

4. The variable gain amplifier of claim 3, wherein the successive amplifying transistors have channel widths that are multiples of a channel width of the first amplifying transistor.

5. The variable gain amplifier of claim 3, wherein channel widths of successive ones of the positive coefficient transistors are multiples of a channel width of a first one of the positive coefficient transistors corresponding to the first amplifying transistor.

6. The variable gain amplifier of claim 1, wherein a gate of each one of the plurality of positive coefficient transistors is configured to receive a bit of the first binary code, and
wherein a gate of each one of the plurality of negative coefficient transistors is configured to receive a bit of the second binary code.

7. The variable gain amplifier of claim 1, wherein the first and second binary codes are supplied by a gain controller.

8. The variable gain amplifier of claim 1, further comprising:
a second transconductor circuit coupled to a second input terminal of the variable gain amplifier, and coupled to the first output terminal and the second output terminal.

9. The variable gain amplifier of claim 8, wherein the first and second input terminals correspond to differential input terminals of the variable gain amplifier, and
wherein the first and second output terminals correspond to differential output terminals of the variable gain amplifier.

10. The variable gain amplifier of claim 8, wherein the first and second transconductor circuits are configured to generate a differential current output.

11. The variable gain amplifier of claim 8, wherein the first transconductor circuit is configured to generate a first amplified signal at the first output terminal, the first amplified signal corresponding to a summation of currents of activated ones of the positive coefficient transistors of the first transconductor circuit minus currents of activated ones of negative coefficient transistors of the second transconductor circuit.

12. The variable gain amplifier of claim 8, wherein the second transconductor circuit is configured to generate a second amplified signal at the second output terminal, the second amplified signal corresponding to a summation of currents of activated ones of positive coefficient transistors of the second transconductor circuit minus currents of activated ones of the negative coefficient transistors of the first transconductor circuit.

13. A variable gain amplifier comprising:
a first transconductor circuit coupled to a first input terminal, a first output terminal, and a second output terminal of the variable gain amplifier; and
a second transconductor circuit coupled to a second input terminal of the variable gain amplifier, and coupled to the first output terminal and the second output terminal,
each of the first and second transconductor circuits comprising:
a plurality of positive coefficient transistors coupled to one of the first and second output terminals and configured to selectively conduct current in response to a first binary code, each of the positive coefficient transistors receiving a different bit of the first binary code;
a plurality of negative coefficient transistors coupled to the an other of the first and second output terminals and configured to selectively conduct current in response to a second binary code, each of the negative coefficient transistors receiving a different bit of the second binary code; and
a plurality of amplifying transistors, each having a gate electrode coupled to a same one of the first and second input terminals such that each of the gate electrodes of the plurality of amplifying transistors receives the same signal with the same voltage from the same of the first and second input terminals, a first electrode coupled to a ground reference, and a second electrode coupled to a different pair of coefficient transistors comprising one of the plurality of positive coefficient transistors and one of the plurality of negative coefficient transistors.

14. The variable gain amplifier of claim 13, wherein the first and second input terminals correspond to differential input terminals of the variable gain amplifier,
wherein the first and second output terminals correspond to differential output terminals of the variable gain amplifier, and
wherein the first and second transconductor circuits are configured to generate a differential current output.

15. The variable gain amplifier of claim 13, wherein the first transconductor circuit is configured to generate a first amplified signal at the first output terminal, the first amplified signal corresponding to a summation of currents of activated ones of the positive coefficient transistors of the first transconductor circuit minus currents of activated ones of negative coefficient transistors of the second transconductor circuit.

16. The variable gain amplifier of claim 13, wherein the second transconductor circuit is configured to generate a second amplified signal at the second output terminal, the second amplified signal corresponding to a summation of currents of activated ones of positive coefficient transistors of the second transconductor circuit minus currents of activated ones of the negative coefficient transistors of the first transconductor circuit.

17. The variable gain amplifier of claim 13, wherein a gate of each one of the plurality of positive coefficient transistors is configured to receive a bit of the first binary code, and
wherein a gate of each one of the plurality of negative coefficient transistors is configured to receive a bit of the second binary code.

18. The variable gain amplifier of claim 13, wherein the plurality of amplifying transistors comprises a first amplifying transistor and successive amplifying transistors,
wherein the first amplifying transistor is configured to conduct a first current signal and the successive amplifying transistors are configured to conduct multiples of the first current signal, and
wherein the successive amplifying transistors have channel widths that are multiples of a channel width of the first amplifying transistor.

19. The variable gain amplifier of claim 18, wherein channel widths of successive ones of the positive coefficient transistors are multiples of a channel width of a first one of the positive coefficient transistors corresponding to the first amplifying transistor.

20. A phase shifter comprising:
a first variable gain amplifier configured to scale an amplitude of a first quadrature vector based on a first binary code and a second binary code; and
a second variable gain amplifier configured to scale an amplitude of a second quadrature vector based on a third binary code and a fourth binary code, the first variable gain amplifier having a first input terminal, a second input terminal, a first output terminal, and a second output terminal, and comprising:
- a first transconductor circuit coupled to the first input terminal and the first and second output terminals; and
- a second transconductor circuit coupled to the second input terminal and the first and second output terminals,
- each of the first and second transconductor circuits comprising:
  - a plurality of positive coefficient transistors coupled to one of the first and second output terminals and configured to selectively conduct current in response to a first binary code, each of the positive coefficient transistors receiving a different bit of the first binary code;
  - a plurality of negative coefficient transistors coupled to the an other of the first and second output terminals and configured to selectively conduct current in response to a second binary code, each of the negative coefficient transistors receiving a different bit of the second binary code; and
  - a plurality of amplifying transistors, each having a gate electrode coupled to a same one of the first and second input terminals such that each of the gate electrodes of the plurality of amplifying transistors receives the same signal with the same voltage from the same of the first and second input terminal, a first electrode coupled to a ground reference, and a second electrode coupled to a different pair of coefficient transistors comprising one of the plurality of positive coefficient transistors and one of the plurality of negative coefficient transistors.

* * * * *